(12) United States Patent
Wu et al.

(10) Patent No.: US 11,150,530 B1
(45) Date of Patent: Oct. 19, 2021

(54) MANUFACTURING METHOD OF DISPLAY PANEL

(71) Applicant: GIANTPLUS TECHNOLOGY CO., LTD, Miaoli County (TW)

(72) Inventors: Che-Yao Wu, Taoyuan (TW); Kai-Ju Chou, Taoyuan (TW); I-Ta Jiang, New Taipei (TW)

(73) Assignee: GIANTPLUS TECHNOLOGY CO., LTD, Miaoli County (TW)

( * ) Notice: Subject to any disclaimer, the term of this patent is extended or adjusted under 35 U.S.C. 154(b) by 0 days.

(21) Appl. No.: 17/073,411

(22) Filed: Oct. 19, 2020

(30) Foreign Application Priority Data

Sep. 16, 2020 (TW) .................................. 109131890

(51) Int. Cl.
*G02F 1/1362* (2006.01)

(52) U.S. Cl.
CPC .. *G02F 1/136286* (2013.01); *G02F 1/136295* (2021.01)

(58) Field of Classification Search
None
See application file for complete search history.

(56) References Cited

U.S. PATENT DOCUMENTS

| 2006/0119753 | A1* | 6/2006 | Luo | G02F 1/136213 349/38 |
| 2010/0032677 | A1 | 2/2010 | Lee et al. | |
| 2011/0128459 | A1* | 6/2011 | Chu | H01L 27/1248 349/38 |
| 2011/0149184 | A1* | 6/2011 | Tsai | G02F 1/136213 349/38 |
| 2015/0035167 | A1* | 2/2015 | Wang | H01L 27/124 257/774 |
| 2016/0358948 | A1* | 12/2016 | Wang | H01L 27/1255 |

(Continued)

FOREIGN PATENT DOCUMENTS

| CN | 207924329 | 9/2018 |
| CN | 110197623 | 9/2019 |

(Continued)

OTHER PUBLICATIONS

Office Action of Taiwan Counterpart Application, dated May 19, 2021, pp. 1-3.

*Primary Examiner* — Shan Liu
(74) *Attorney, Agent, or Firm* — JCIPRNET

(57) ABSTRACT

A manufacturing method of a display panel including following steps is provided. Providing a substrate. Forming a first metal layer including a first storage electrode on the substrate. Forming a first insulating layer on the first metal layer. Forming a second metal layer including a second storage electrode on the first insulating layer. Forming a second insulating layer on the second metal layer. Forming a third metal layer including a third storage electrode on the second insulating layer. A first storage capacitance is constituted by the first storage electrode and the second storage electrode as well as the first insulating layer located between the first storage electrode and the second storage electrode, and a second storage capacitance is constituted by the second storage electrode and the third storage electrode as well as the second insulating layer located between the second storage electrode and the third storage electrode.

6 Claims, 4 Drawing Sheets

(56) References Cited

U.S. PATENT DOCUMENTS

| | | |
|---|---|---|
| 2017/0104010 A1 | 4/2017 | Hekstra |
| 2019/0221170 A1* | 7/2019 | Yamazaki ............. G02F 1/1337 |
| 2020/0111913 A1 | 4/2020 | Yamazaki et al. |
| 2020/0161338 A1* | 5/2020 | Yoshida ............ G02F 1/136286 |

FOREIGN PATENT DOCUMENTS

| | | |
|---|---|---|
| EP | 2808917 | 12/2018 |
| TW | 201207998 | 2/2012 |
| TW | I686648 | 3/2020 |
| WO | 2011043196 | 4/2011 |

\* cited by examiner

MANUFACTURING METHOD OF DISPLAY PANEL

CROSS-REFERENCE TO RELATED APPLICATION

This application claims the priority benefit of Taiwan application serial no. 109131890, filed on Sep. 16, 2020. The entirety of the above-mentioned patent application is hereby incorporated by reference herein and made a part of this specification.

BACKGROUND

Technical Field

The disclosure is related to a manufacturing method of a display panel, and particularly to a manufacturing method of a display panel with increased storage capacitance.

Description of Related Art

Referring to FIG. 5, a scan line 20 is a portion of a first metal layer and a data line 30 is a portion of a second metal layer in a non-rectangular (such as circular) display panel 10, wherein the data line 30 is located above the scan line 20. A portion of a common voltage line located in a non-display area 10b of the prior art, surrounding a display area 10a, would be connected to the data line 30 to generate the short circuit since the common voltage line of the prior art is also made by the second metal layer, thereby making the display panel 10 a failure in enablement.

A third metal layer could be formed to be used as the common voltage line to solve the above problem. However, the characteristic of the display panel is not improved, which means that the manufacturing cost is increased. Therefore, a target of the present disclosure is to make the third metal layer be effectively used in the display panel, thereby improving the characteristic of the display panel.

SUMMARY

An embodiment of the disclosure provides a manufacturing method of a display panel, the display panel manufactured by the method has an increased storage capacitance and a good electrical property by forming a third storage electrode.

A manufacturing method of a display panel according to an embodiment of the disclosure includes following steps. Providing a substrate. Forming a first metal layer on the substrate, wherein the first metal layer includes a gate, a first storage electrode, a scan line, and a first common voltage supply line, the gate is connected to the scan line, and the first storage electrode is connected to the first common voltage supply line. Forming a first insulating layer on the first metal layer, wherein the first insulating layer covers the first metal layer. Forming a second metal layer on the first insulating layer, wherein the second metal layer includes a source, a drain, a second storage electrode, and a data line, the source is connected to the data line, the drain is electrically connected to the second storage electrode, and the scan line intersects the data line. Forming a second insulating layer on the second metal layer, wherein the second insulating layer includes an opening exposing a portion of the second storage electrode. Forming a third metal layer on the second insulating layer, wherein the third metal layer includes a third storage electrode, a common voltage line, and a second common voltage supply line, and the third storage electrode is connected to the second common voltage supply line. The common voltage line is located in the non-display area and is electrically connected to the first common voltage supply line and the second common voltage supply line. A first storage capacitance is constituted by the first storage electrode and the second storage electrode as well as the first insulating layer located between the first storage electrode and the second storage electrode, and a second storage capacitance is constituted by the second storage electrode and the third storage electrode as well as the second insulating layer located between the second storage electrode and the third storage electrode.

In one embodiment of the disclosure, the manufacturing method of the display panel further includes forming a first contact window penetrating the first insulating layer and the second insulating layer to expose a portion of the first common voltage supply line before forming the third metal layer on the second insulating layer, wherein the common voltage line is electrically connected to the first common voltage supply line through the first contact window.

In one embodiment of the disclosure, a step of forming the second insulating layer on the second metal layer includes forming a second insulating material layer on the second metal layer, wherein the second insulating material layer covers the second metal layer, and patterning the second insulating material layer to form the second insulating layer including the opening.

In one embodiment of the disclosure, the second insulating layer and the second metal layer is formed by performing a patterning process and using the same mask.

In one embodiment of the disclosure, the manufacturing method of the display panel further includes forming a semiconductor layer on the first insulating layer before forming the second metal layer on the first insulating layer, wherein the source and the drain partially cover the semiconductor layer.

In one embodiment of the disclosure, the manufacturing method of the display panel further includes following steps after forming the third metal layer on the second insulating layer. Forming a third insulating layer on the third metal layer, wherein the third insulating layer includes a second contact window exposing a portion of the second storage electrode. Forming a pixel electrode on the third insulating layer, wherein the pixel electrode is electrically connected to the drain through the second contact window. Forming a reflective electrode on the pixel electrode.

Based on the above, another storage capacitance is constituted by the third storage electrode and the second storage electrode as well as the second insulating layer located between thereof in the manufacturing method of the display panel according to the present disclosure. Therefore, a storage capacitance of one pixel structure in the display panel according to the present disclosure could be increased and a greater voltage could be stored, thereby making the display panel according to the present disclosure have a good electrical property. Furthermore, a portion of the third metal layer is disposed in the non-display area to be used as the common voltage line in the manufacturing method of the display panel according to the present disclosure, which could prevent the common voltage line from being connected to the data line or the scan line, so as to make the display panel according to the present disclosure enablement.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
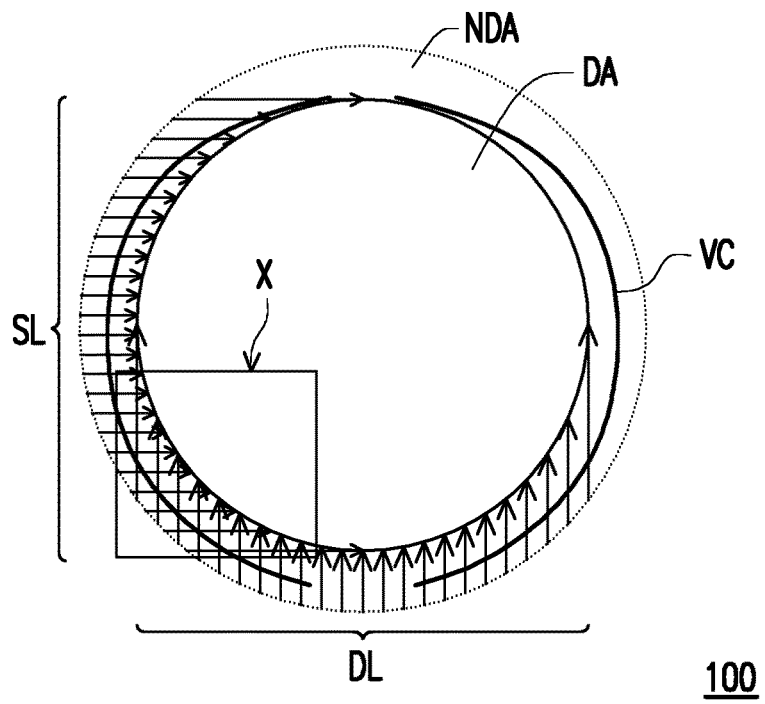
FIG. 1 is a schematic top view of a display panel according to one embodiment of the disclosure.

The disclosure is more comprehensively described with reference to the figures of the present embodiments. However, the disclosure may also be implemented in various different forms, and is not limited to the embodiments in the present specification. The thicknesses of the layers and regions in the figures are enlarged for clarity. The same or similar reference numerals represent the same or similar devices and are not repeated in the following paragraphs. Additionally, directional terminology, such as "top," "bottom," "left," "right," "front," or "back," etc., is used with reference to the orientation of the Figure(s) being described. As such, the directional terminology is used for purposes of illustration and is in no way limiting.

Figure 2:
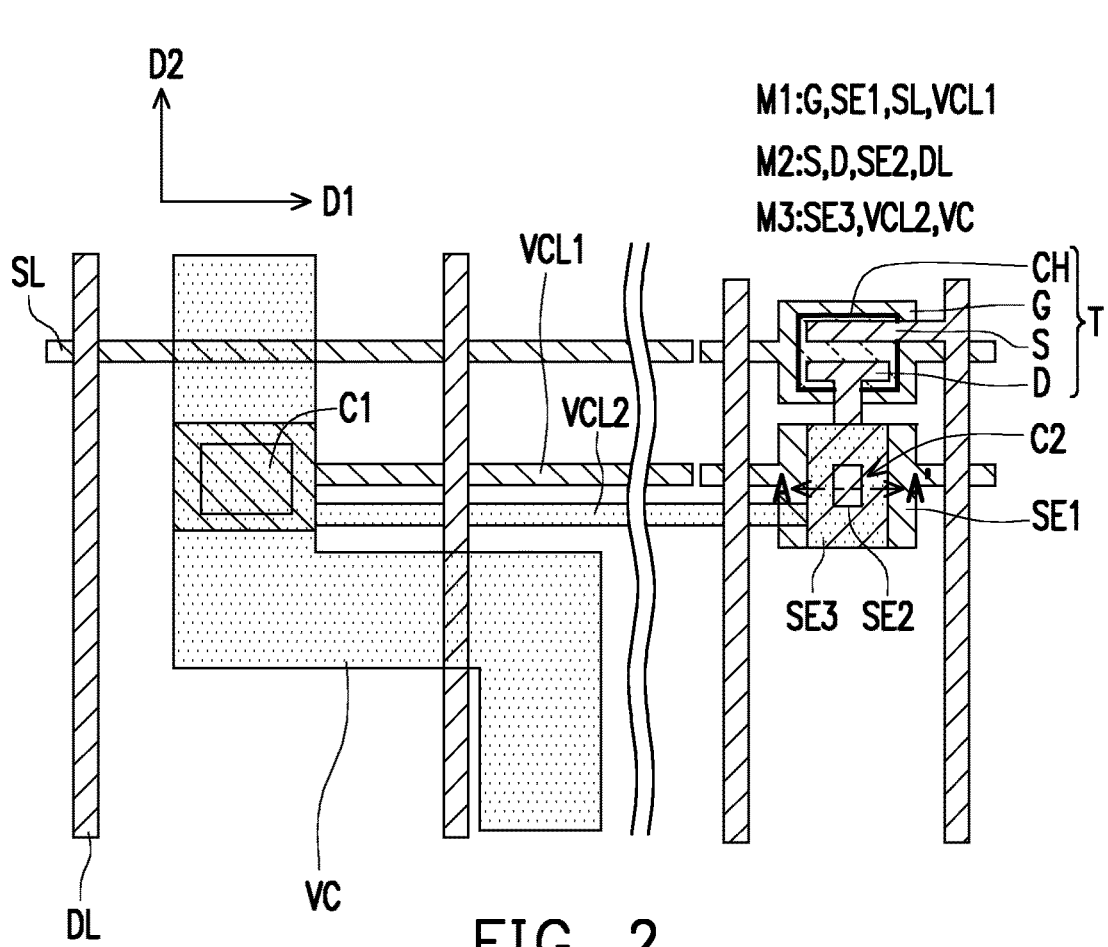
FIG. 2 is an enlarged schematic top view of region X in FIG. 1.
Figure 3:
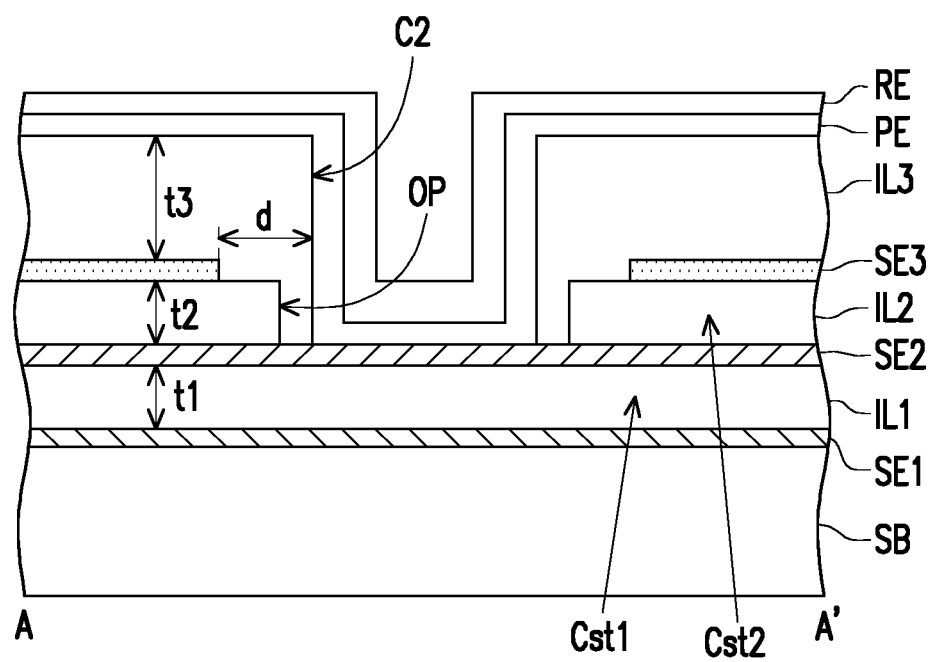
FIG. 3 is a schematic cross-sectional view taken along a sectional line A-A' depicted in FIG. 2.
Figure 4:
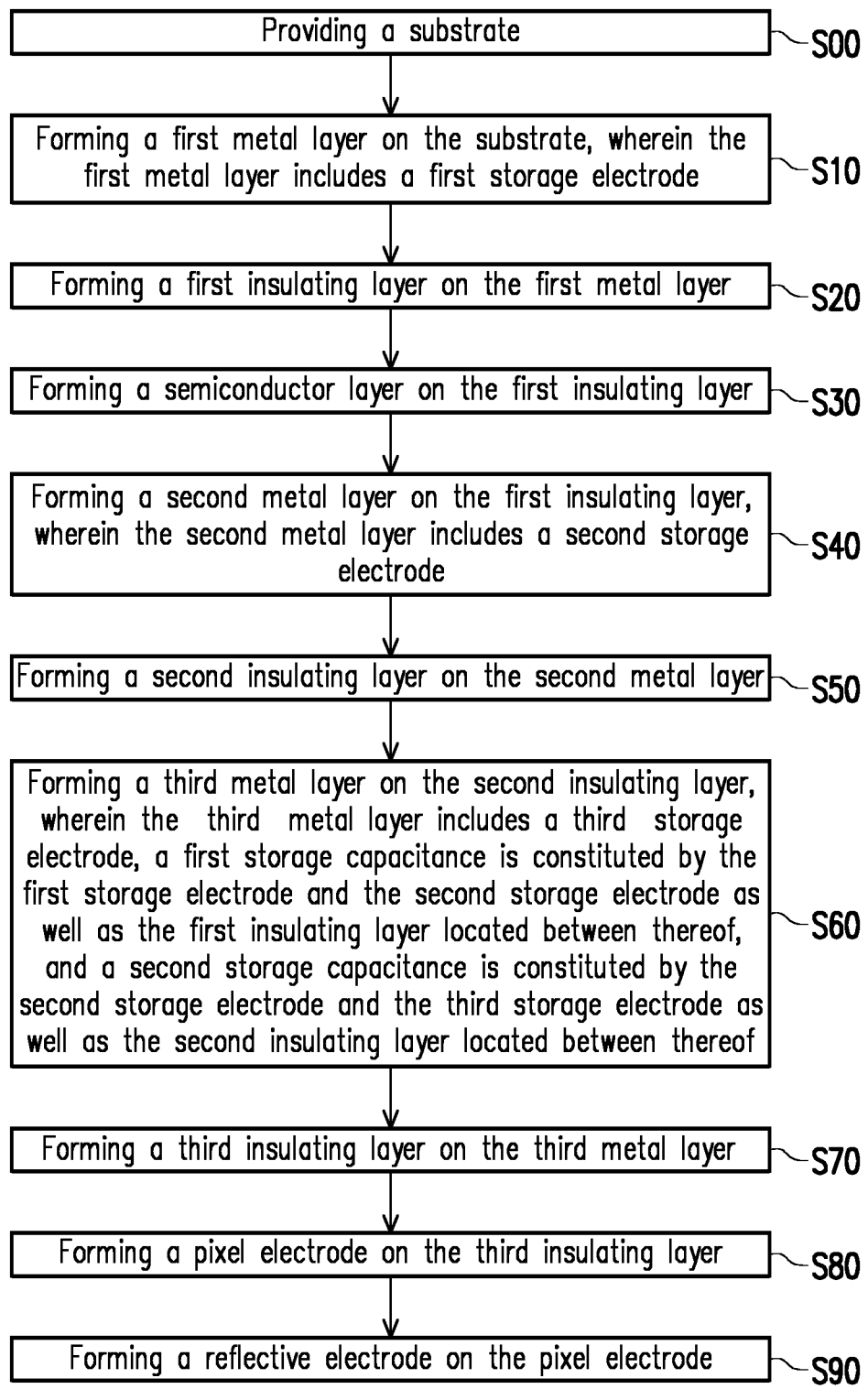
FIG. 4 is a flow diagram of a manufacturing method of a display panel according to one embodiment of the disclosure.
Figure 5:
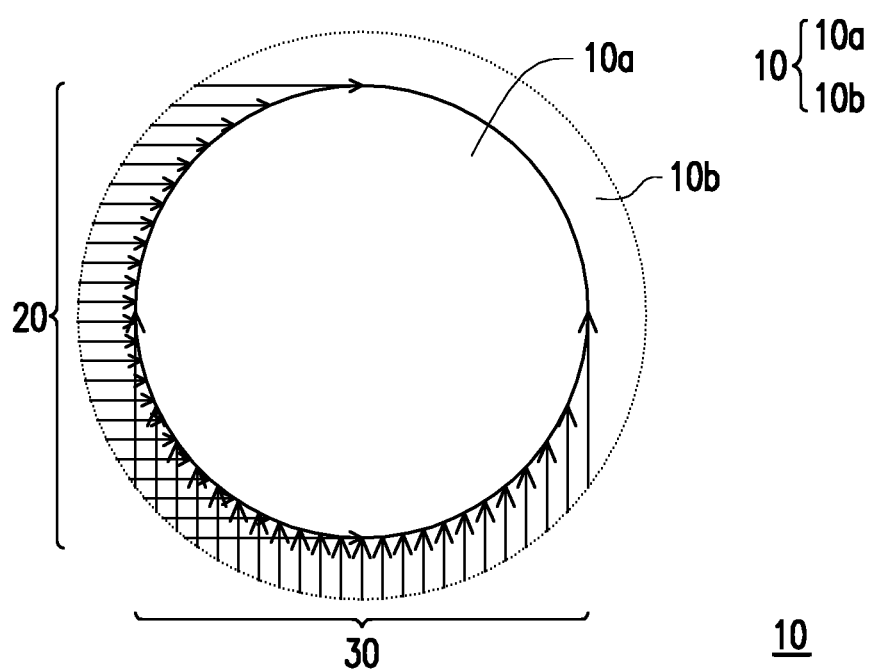
FIG. 5 is a schematic top view of a display panel of the prior art.

FIG. 1 is a schematic top view of a display panel according to one embodiment of the disclosure, FIG. 2 is an enlarged schematic top view of region X in FIG. 1, FIG. 3 is a schematic cross-sectional view taken along a sectional line A-A' depicted in FIG. 2, and FIG. 4 is a flow diagram of a manufacturing method of a display panel according to one embodiment of the disclosure.

Simultaneously referring to FIGS. 1-4, in step S00, providing a substrate SB. The substrate SB is, for example, a flexible substrate, which could be a polymer substrate or a plastic substrate, but the disclosure is not limited thereto. In another embodiment, the substrate SB could be a rigid substrate, which could be a glass substrate, a quartz substrate or a silicon substrate.

In step S10, forming a first metal layer M1 on the substrate SB. The forming method of the first metal layer M1 is performed, for example, by using a physical vapor deposition (PVD) method or a chemical vapor deposition (CVD) method followed by a photolithography and etching process. As an exemplified example of the formation of the first metal layer M1, the PVD method or the CVD method may be used first to form a first metal material layer (not shown) on the overall substrate SB. Next, a patterned photoresist layer (not shown) is formed on the first metal material layer. Thereafter, the patterned photoresist layer is used as a mask to perform an etching process to the first metal material layer, thereby forming the first metal layer M1. In one embodiment, the first metal layer M1 includes a gate G, a first storage electrode SE1, a scan line SL, and a first common voltage supply line VCL1. The gate G is connected to, for example, the corresponding scan line SL to receive the corresponding gate voltage. The first storage electrode SE1 is connected to the first common voltage supply line VCL1 to receive the corresponding common voltage. The first common voltage supply line VCL1 could be used to, for example, transport the common voltage supplied from a common voltage line VC which would be introduced later to supply the common voltage to the first storage electrode SE1.

In step S20, forming a first insulating layer IL1 on the first metal layer M1. The first insulating layer IL1 is located, for example, on the substrate SB and covers the first metal layer M1. Namely, the first insulating layer IL1 may cover the gate G, the first storage electrode SE1, the scan line SL, and the first common voltage supply line VCL1. The forming method of the first insulating layer IL1 is performed, for example, by using a PVD method or a CVD method. In the present embodiment, a material of the first insulating layer IL1 may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The first insulating layer IL1 may be, for example, a single-layered structure, but the disclosure is not limited thereto. In other embodiments, the first insulating layer IL1 may be a multi-layered structure.

In step S30, forming a semiconductor layer CH on the first insulating layer IL1. The forming method of the semiconductor layer CH is performed, for example, by using a photolithography and etching process. As an exemplified example of the formation of the semiconductor layer CH, the PVD method or the metal chemical vapor deposition (MCVD) method may be used first to form a semiconductor material layer (not shown) on the first insulating layer IL1. Next, a patterned photoresist layer (not shown) is formed on the semiconductor material layer. Thereafter, the patterned photoresist layer is used as a mask to perform an etching process to the semiconductor material layer, thereby forming the semiconductor layer CH. A material of the semiconductor layer CH may be, for example, amorphous silicon, but the disclosure is not limited thereto. The material of the semiconductor layer CH may also be, for example, polycrystalline silicon, microcrystalline silicon, single crystalline silicon, nanocrystalline silicon, or other semiconductor materials or metal oxide semiconductor materials having different lattice orientation.

In step S40, forming a second metal layer M2 on the first insulating layer IL1. The forming method of the second metal layer M2 is performed, for example, by using a PVD method or a CVD method followed by a photolithography and etching process. As an exemplified example of the formation of the second metal layer M2, the PVD method or the CVD method may be used first to form a second metal material layer (not shown) on the overall first insulating layer IL1. Next, a patterned photoresist layer (not shown) is formed on the second metal material layer. Thereafter, the patterned photoresist layer is used as a mask to perform an etching process to the second metal material layer, thereby forming the second metal layer M2. In one embodiment, the second metal layer M2 includes a source S, a drain D, a second storage electrode SE2, and a data line DL. The source S is connected to, for example, the corresponding data line DL to receive the corresponding data voltage. The drain D is connected to, for example, the second storage electrode SE2 to also receive the corresponding data voltage. In the present embodiment, a first storage capacitance Cst1 is constituted by the second storage electrode SE2 and the first storage electrode SE1 as well as the first insulating layer IL1 located between thereof. The first storage capacitance Cst1 could be used to store the driving voltage, the amount of which may influence orientation of the liquid crystals (not shown).

In the present embodiment, an active component T may be constituted by the gate G, the source S, the drain D, and the semiconductor layer CH. The semiconductor layer CH is, for example, correspondingly disposed to the gate G and is partially covered by the source S and the drain D. A portion, not being covered by the source S and the drain D, of the semiconductor layer CH could be used as a channel layer (not shown) of the active component T. The active component T may be, for example, any kind of bottom-gate thin film transistor that is known to persons having ordinary skill in the art. However, the bottom-gate thin film transistor is just an exemplified example of the present embodiment, the disclosure is not limited thereto. In other embodiments, the active component T may be a top-gate thin film transistor or another suitable type of thin film transistor.

In step S50, forming a second insulating layer IL2 on the second metal layer M2. The second insulating layer IL2 is located, for example, on the first insulating layer IL1 and partially covers the second metal layer M2. In detail, the second insulating layer IL2 may cover the source S, the drain D, and the data line DL, and partially cover the second storage electrode SE2. In the present embodiment, the second insulating layer IL2 includes an opening OP exposing a portion of the first storage electrode SE1, wherein the opening OP is located in a display area DA. The forming method of the second insulating layer IL2 is performed, for example, by using a PVD method or a CVD method followed by a photolithography and etching process. As an exemplified example of the formation of the second insulating layer IL2, the PVD method or the CVD method may be used first to form a second insulating material layer (not shown) on the overall first insulating layer IL1 to cover the second metal layer M2. Next, a patterned photoresist layer (not shown) is formed on the second insulating material layer. Thereafter, the patterned photoresist layer is used as a mask to perform an etching process to the second insulating material layer, thereby forming the second insulating layer IL2 including the opening OP. It is worth mentioned that the opening OP of the second insulating layer IL2 and the channel layer of the above active component T are defined by the same mask. Namely, the second insulating layer IL2 and the second metal layer M2 are formed by using the same mask. Therefore, the manufacturing cost is not increased for forming the opening OP of the second insulating layer IL2. In the present embodiment, a material of the second insulating layer IL2 may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The second insulating layer IL2 may be, for example, a single-layered structure, but the disclosure is not limited thereto. In other embodiments, the second insulating layer IL2 may be a multi-layered structure.

In addition, the second insulating layer IL2 and the first insulating layer IL1 further include a first contact window C1 exposing a portion of the first common voltage supply line VCL1, wherein the first contact window C1 is located in the non-display area NDA. It is worth mentioned that the first contact window C1 of the second insulating layer IL2, the opening OP of the second insulating layer IL2 and the channel layer of the above active component T are also defined by the same mask.

In step S60, forming a third metal layer M3 on the second insulating layer IL2. The forming method of the third metal layer M3 is performed, for example, by using a PVD method or a CVD method followed by a photolithography and etching process. As an exemplified example of the formation of the third metal layer M3, the PVD method or the CVD method may be used first to form a third metal material layer (not shown) on the overall second insulating layer IL2. Next, a patterned photoresist layer (not shown) is formed on the third metal material layer. Thereafter, the patterned photoresist layer is used as a mask to perform an etching process to the third metal material layer, thereby forming the third metal layer M3. In one embodiment, the third metal layer M3 includes a third storage electrode SE3, a common voltage line VC, and a second common voltage supply line VCL2. In detail, the third storage electrode SE3 is located in the display area DA, the common voltage line VC is located in the non-display area NDA, and the second common voltage supply line VCL2 is connected to the third storage electrode SE3 and the common voltage line VC. Based on the above, the third storage electrode SE3 connecting to the second common voltage supply line VCL2 could receive the corresponding common voltage supplied from the common voltage line VC, so that a second storage capacitance Cst2 could be constituted by the third storage electrode SE3 and the second storage electrode SE2 as well as the second insulating layer IL2 located between thereof. The second storage capacitance Cst2 could be used to store the driving voltage, the amount of which may influence orientation of the liquid crystals (not shown). In addition, in the present embodiment, the common voltage line VC is electrically connected to the first common voltage supply line VCL1 through the first contact window C1, so that the first storage electrode SE1 connecting to the first common voltage supply line VCL1 could receive the corresponding common voltage supplied from the common voltage line VC.

In step S70, forming a third insulating layer IL3 on the third metal layer M3. The third insulating layer IL3 is located, for example, on the second insulating layer IL2, and covers the third metal layer M3 and partially covers the second metal layer M2. In detail, the third insulating layer IL3 includes a second contact window C2 exposing a portion of the drain D. The forming method of the third insulating layer IL3 is performed, for example, by using a PVD method or a CVD method followed by a photolithography and etching process. As an exemplified example of the formation of the third insulating layer IL3, the PVD method or the CVD method may be used first to form a third insulating material layer (not shown) on the overall second insulating layer IL2 to cover the third metal layer M3. Next, a patterned photoresist layer (not shown) is formed on the third insulating material layer. Thereafter, the patterned photoresist layer is used as a mask to perform an etching process to the third insulating material layer, thereby forming the third insulating layer IL3 including the second contact window C2. It is worth mentioned that the second contact window C2 formed in the third insulating layer IL3 overlaps the opening OP formed in the second insulating layer IL2, so that the third insulating layer IL3 could expose a portion of the drain D. In the present embodiment, a material of the third insulating layer IL3 may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The third insulating layer IL3 may be, for example, a single-layered structure, but the disclosure is not limited thereto. In other embodiments, the third insulating layer IL3 may be a multi-layered structure.

In step S80, forming a pixel electrode PE on the third insulating layer IL3. The forming method of the pixel electrode PE is performed, for example, by using a PVD method or a CVD method followed by a photolithography and etching process. As an exemplified example of the formation of the pixel electrode PE, the PVD method or the CVD method may be used first to form a pixel electrode material layer (not shown) on the overall third insulating layer IL3. Next, a patterned photoresist layer (not shown) is formed on the pixel electrode material layer. Thereafter, the patterned photoresist layer is used as a mask to perform an etching process to the pixel electrode material layer, thereby forming the pixel electrode PE. A material of the pixel electrode PE may be, for example, a metal oxide conductive material (e.g., indium-tin-oxide, indium-zinc-oxide, aluminum-tin-oxide, aluminum-zinc-oxide, indium-germanium-zinc-oxide). In the present embodiment, the pixel electrode PE is electrically connected to the drain D of the active component T through the second contact window C2.

In step S90, forming a reflective electrode RE on the pixel electrode PE, wherein the reflective electrode RE is electrically connected to the pixel electrode PE. The forming method of the reflective electrode RE is performed, for example, by using a PVD method or a CVD method followed by a photolithography and etching process. As an exemplified example of the formation of the reflective electrode RE, the PVD method or the CVD method may be used first to form a reflective electrode material layer (not shown) on the overall pixel electrode PE. Next, a patterned photoresist layer (not shown) is formed on the reflective electrode material layer. Thereafter, the patterned photoresist layer is used as a mask to perform an etching process to the reflective electrode material layer, thereby forming the reflective electrode RE. The reflective electrode RE may be, for example, formed by using a metal material having a reflectance larger than or equal to 90%. In the present embodiment, a material of the reflective electrode RE is aluminum, silver, or alloy thereof, but the disclosure is not limited thereto.

So far a fabrication of the display panel is accomplished.

The manufacturing method 1 of the display panel of the present embodiment is explained as an example by the above method, but the forming method of the display panel according to the disclosure is not limited thereto.

In summary, a portion of the third metal layer located in the display area is used as the third storage electrode in the manufacturing method of the display panel according to the present disclosure, so that another storage capacitance could be constituted by the third storage electrode and the second storage electrode as well as the second insulating layer located between thereof. Therefore, a storage capacitance of one pixel structure in the display panel according to the present disclosure could be increased and a greater voltage could be stored, thereby making the display panel according to the present disclosure have a good electrical property. Furthermore, a portion of the third metal layer is disposed in the non-display area to be used as the common voltage line in the manufacturing method of the display panel according to the present disclosure, which could prevent the common voltage line from being connected to the data line or the scan line, so as to make the display panel according to the present disclosure enablement. In addition, the second common voltage supply line connecting to the third storage electrode and the common voltage line also belongs to a portion of the third metal layer, so that there is no need to form another metal layer to be used as the second common voltage supply line, thereby decreasing the manufacturing cost.

Continuously referring to FIGS. 1-3, a display panel 100 according to the present disclosure includes a substrate SB, a first metal layer M1, a first insulating layer IL1, a second metal layer M2, a second insulating layer IL2, a third metal layer M3, a third insulating layer IL3, a pixel electrode PE, and a reflective electrode RE, as shown in FIGS. 1-3. In one embodiment, the display panel 100 includes a free form display panel. Namely, the display panel 100 has a non-rectangular shape. For example, the display panel 100 has a circular shape, but the disclosure is not limited thereto. It should be noted here that the description of the same technical contents is omitted. For the description of the omitted part, reference is made to the description and effects of the foregoing embodiments, and the descriptions thereof are omitted in the following embodiment. For the description of at least a part of the present embodiment that is not omitted, reference is made to the contents below.

The substrate SB has a display area DA and a non-display area NDA, wherein the non-display area NDA is disposed adjacent to the display area DA. In one embodiment, the non-display area NDA surrounds the display area DA. In the present embodiment, the display area DA includes an array of a plurality of pixels, and the non-display area NDA includes a plurality of periphery devices for circuitry control. For the material included in the substrate SB, reference is made to the description and effects of the foregoing embodiments, and the descriptions thereof are omitted in the present embodiment.

The first metal layer M1 is, for example, disposed on the substrate SB, and includes a gate G, a first storage electrode SE1, a scan line SL, and a first common voltage supply line VCL1. In one embodiment, the gate G is connected to the scan line SL, and the first storage electrode SE1 is connected to the first common voltage supply line VCL1. The scan line SL and the first common voltage supply line VCL1 are, for example, extended toward a first direction D1.

The first insulating layer IL1 is, for example, disposed on the first metal layer M1. In one embodiment, the first insulating layer IL1 located in the non-display area NDA includes a first contact window C1 exposing a portion of the first common voltage supply line VCL1, which is used to make the first common voltage supply line VCL1 be electrically connected to a common voltage line VC of the third metal layer M3 introduced later. In one embodiment, a thickness t1 of the first insulating layer IL1 is 0.1 μm~1 μm.

The second metal layer M2 is, for example, disposed on the first insulating layer IL1 and includes a source S, a drain D, a second storage electrode SE2, and a data line DL. The source S is connected to the data line DL, and the drain D is connected to the second storage electrode SE2. The data line DL is, for example, extended toward a second direction D2 orthogonal to the first direction D1. Namely, the scan line SL intersects the data line DL.

The semiconductor layer CH is, for example, disposed between the first insulating layer IL1 and the second metal layer M2. In one embodiment, the source S and the drain D of the second metal layer M2 partially cover the semiconductor layer CH.

The second insulating layer IL2 is, for example, disposed on the second metal layer M2. In one embodiment, the second insulating layer IL2 located in the non-display area NDA includes the first contact window C1 exposing the portion of the first common voltage supply line VCL1, which is used to make the first common voltage supply line VCL1 be electrically connected to the common voltage line VC of the third metal layer M3 introduced later. Namely, the first contact window C1 penetrates the first insulating layer IL1 and the second insulating layer IL2. In addition, in one embodiment, the second insulating layer IL2 located in the display area DA includes an opening OP exposing a portion of the drain D, which is used to make the drain D be electrically connected to a pixel electrode PE introduced later. In one embodiment, a thickness t2 of the second insulating layer IL2 is 0.1 µm~2 µm.

The third metal layer M3 is, for example, disposed on the second insulating layer IL2 and includes a third storage electrode SE3, a common voltage line VC, and a second common voltage supply line VCL2, wherein the third storage electrode SE3 is connected to the second common voltage supply line VCL2. The third storage electrode SE3 is located in the display area DA, the common voltage line VC is located in the non-display area NDA, and the second common voltage supply line VCL2 is, for example, extended toward the first direction D1 and connected to the third storage electrode SE3 and the common voltage line VC. In addition, the common voltage line VC could be electrically connected to the first common voltage supply line VCL1 through the first contact window C1. Since a portion of the third metal layer M3 is used as the common voltage line VC in the present embodiment, which could avoid the problem that the common voltage line of prior art made of the first metal layer M1 or the second metal layer M2 would be connected to the data line DL or the scan line SL to generate the short circuit, thereby making the free form display panel a failure in enablement.

In the present embodiment, a first storage capacitance Cst1 is constituted by the first storage electrode SE1 and the second storage electrode SE2 as well as the first insulating layer IL1 located between the first storage electrode SE1 and the second storage electrode SE2, and a second storage capacitance Cst2 is constituted by the second storage electrode SE2 and the third storage electrode SE3 as well as the second insulating layer IL2 located between the second storage electrode SE2 and the third storage electrode SE3. Based on the above, a storage capacitance of one pixel structure in the display panel 100 according to the present embodiment is a sum of the first storage capacitance Cst1 and the second storage capacitance Cst2, so that a greater voltage could be stored by the storage capacitance, thereby making the display panel 100 according to the present embodiment have a good electrical property. In addition, the thickness t2 of the second insulating layer IL2 located between the second storage electrode SE2 and the third storage electrode SE3 could be adjusted depending on the requirement, thereby making the display panel 100 according to the present embodiment have an improved process allowance.

The third insulating layer IL3 is, for example, disposed on the third metal layer M3. In one embodiment, the third insulating layer IL3 located in the display area DA includes the second contact window C2 exposing the portion of the drain D, which is used to make the drain D be electrically connected to a pixel electrode PE introduced later. In one embodiment, a thickness t3 of the third insulating layer IL3 is 1 µm~5 µm. In addition, a specific distance is between the third storage electrode SE3 and the second contact window C2, there preventing the third storage electrode SE3 from being connected to the drain D to generate the short circuit. In one embodiment, the distance d between the third storage electrode SE3 and the second contact window C2 is 1 µm~10 µm.

A pixel electrode PE is, for example, disposed on the third insulating layer IL3 and electrically connected to the drain D. A reflective electrode RE is, for example, disposed on the pixel electrode PE and electrically connected to the pixel electrode PE. In one embodiment, the pixel electrode PE is electrically connected to the reflective electrode RE through the second contact window C2 penetrating the third insulating layer IL3.

In summary, a portion of the third metal layer located in the display area is used as the third storage electrode according to the present disclosure, so that another storage capacitance could be constituted by the third storage electrode and the second storage electrode as well as the second insulating layer located between thereof. Therefore, a storage capacitance of one pixel structure in the display panel according to the present disclosure could be increased and a greater voltage could be stored, thereby making the display panel according to the present disclosure have a good electrical property. Furthermore, a portion of the third metal layer is disposed in the non-display area to be used as the common voltage line according to the present disclosure, which could prevent the common voltage line from being connected to the data line or the scan line, so as to make the display panel according to the present disclosure enablement. In addition, the second common voltage supply line connecting to the third storage electrode and the common voltage line also belongs to a portion of the third metal layer, so that there is no need to form another metal layer to be used as the second common voltage supply line, thereby decreasing the manufacturing cost.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a display panel, including:
   providing a substrate, wherein the substrate has a display area and a non-display area, the non-display area surrounds the display area, wherein the display area is used to form an array of a plurality of pixels, and the non-display area is used to form a plurality of periphery devices for circuitry control;
   forming a first metal layer on the substrate, wherein the first metal layer includes a gate, a first storage electrode, a scan line, and a first common voltage supply line, the gate is connected to the scan line, and the first storage electrode is connected to the first common voltage supply line;
   forming a first insulating layer on the first metal layer, wherein the first insulating layer covers the first metal layer;
   forming a second metal layer on the first insulating layer, wherein the second metal layer includes a source, a drain, a second storage electrode, and a data line, the source is connected to the data line, the drain is electrically connected to the second storage electrode, and the scan line intersects the data line;
   forming a second insulating layer on the second metal layer, wherein the second insulating layer includes an opening exposing a portion of the second storage electrode; and
   forming a third metal layer on the second insulating layer, wherein the third metal layer includes a third storage electrode, a common voltage line, and a second common voltage supply line, and the third storage electrode is connected to the second common voltage supply line, wherein the common voltage line is located in the non-display area and is electrically connected to the first common voltage supply line and the second common voltage supply line, and the common voltage line is electrically connected to the first common voltage supply line through a first contact window located in the non-display area, wherein a first storage capacitance is constituted by the first storage electrode and the second storage electrode as well as the first insulating layer located between the first storage electrode and the second storage electrode, and a second storage capacitance is constituted by the second storage electrode and the third storage electrode as well as the second insulating layer located between the second storage electrode and the third storage electrode.

2. The manufacturing method of the display panel according to claim 1, further including forming the first contact window penetrating the first insulating layer and the second insulating layer to expose a portion of the first common voltage supply line before forming the third metal layer on the second insulating layer.

3. The manufacturing method of the display panel according to claim 1, wherein a step of forming the second insulating layer on the second metal layer includes:

forming a second insulating material layer on the second metal layer, wherein the second insulating material layer covers the second metal layer; and patterning the second insulating material layer to form the second insulating layer including the opening.

4. The manufacturing method of the display panel according to claim 3, wherein the second insulating layer and the second metal layer are formed by performing a patterning process and using the same mask.

5. The manufacturing method of the display panel according to claim 1, further including forming a semiconductor layer on the first insulating layer before forming the second metal layer on the first insulating layer, wherein the source and the drain partially cover the semiconductor layer.

6. The manufacturing method of the display panel according to claim 1, further including following steps after forming the third metal layer on the second insulating layer:

forming a third insulating layer on the third metal layer, wherein the third insulating layer includes a second contact window exposing a portion of the second storage electrode;

forming a pixel electrode on the third insulating layer, wherein the pixel electrode is electrically connected to the drain through the second contact window; and forming a reflective electrode on the pixel electrode.

* * * * *